(12) United States Patent
Sakamoto

(10) Patent No.: US 7,391,458 B2
(45) Date of Patent: Jun. 24, 2008

(54) IMAGE SENSOR MODULE

(75) Inventor: Yuji Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 448 days.

(21) Appl. No.: 10/519,779

(22) PCT Filed: Jun. 27, 2003

(86) PCT No.: PCT/JP03/08250

§ 371 (c)(1),
(2), (4) Date: Dec. 29, 2004

(87) PCT Pub. No.: WO2004/003618

PCT Pub. Date: Jan. 8, 2004

(65) Prior Publication Data

US 2005/0237418 A1 Oct. 27, 2005

(30) Foreign Application Priority Data

Jul. 1, 2002 (JP) ............................. 2002-191834
Jul. 25, 2002 (JP) ............................. 2002-216670
Aug. 2, 2002 (JP) ............................. 2002-225757

(51) Int. Cl.
*H04N 5/225* (2006.01)
(52) U.S. Cl. ..................................................... 348/340
(58) Field of Classification Search ................ 348/340, 348/394, 335; 257/437, 98; 438/25, 26; 359/687, 683, 684
See application file for complete search history.

(56) References Cited

U.S. PATENT DOCUMENTS

| | | | | |
|---|---|---|---|---|
| 5,225,936 A | * | 7/1993 | Sugiura et al. | ............... 359/679 |
| 5,274,456 A | | 12/1993 | Izumi et al. | |
| 5,963,378 A | * | 10/1999 | Tochigi et al. | ............... 359/687 |
| 6,122,009 A | | 9/2000 | Ueda | |
| 6,476,417 B2 | | 11/2002 | Honda et al. | |
| 6,608,648 B1 | * | 8/2003 | Bean | ........................ 348/211.7 |
| 6,801,483 B2 | * | 10/2004 | Hong et al. | ............... 369/44.15 |
| 2001/0012073 A1 | * | 8/2001 | Toyoda et al. | ................ 348/335 |
| 2002/0191103 A1 | * | 12/2002 | Akimoto et al. | ............. 348/374 |

FOREIGN PATENT DOCUMENTS

| | | |
|---|---|---|
| EP | 1 223 749 | 7/2002 |
| JP | 2-27878 | 1/1990 |
| JP | 08-330556 | 12/1996 |
| JP | 9-284617 | 10/1997 |
| JP | 09-322075 | 12/1997 |
| JP | 11-14877 | 1/1999 |
| JP | 2000-121902 | 4/2000 |

(Continued)

*Primary Examiner*—Tuan Ho
*Assistant Examiner*—Amy Hsu
(74) *Attorney, Agent, or Firm*—Hamre, Schumann, Mueller & Larson, P.C.

(57) ABSTRACT

An image sensor module (X1) includes a housing (1), a lens retainer (2), an image sensor chip (4), a substrate (5) and a lens unit (A, B). The housing (1) is formed with a step portion (1a) for fixing the lens unit (A, B). The lens retainer (2) is fixed to the housing (1) and held in contact with the upper face of the lens unit (A, B). The lens unit (A, B) is pressed against the step portion (1a) of the housing (1) by a biasing force of the lens retainer (2).

8 Claims, 14 Drawing Sheets

FOREIGN PATENT DOCUMENTS

| | | |
|---|---|---|
| JP | 2001-51177 | 2/2001 |
| JP | 3084259 | 12/2001 |
| JP | 2002-134725 | 5/2002 |
| JP | 2002-135632 | 5/2002 |
| JP | 2002-139662 | 5/2002 |
| JP | 2003-37758 | 2/2003 |
| JP | 2003-46825 | 2/2003 |
| WO | 96/38980 | 12/1996 |

* cited by examiner

IMAGE SENSOR MODULE

TECHNICAL FIELD

The present invention relates to an image sensor module to be built into digital cameras and portable telephones.

BACKGROUND ART

A conventional image sensor module generally comprises an image sensor chip, a substrate for mounting the chip, and a housing installed on this substrate. The image sensor module further comprises a lens for focusing light from an object onto the image sensor chip for image formation. This lens is retained at a predetermined position in the housing.

In order to obtain a clear image, the lens must be accurately installed with respect to the image sensor chip. However, a conventional image sensor module does not have a simple structure which enables accurate installation of a lens. Therefore, in some cases a clear image cannot be obtained due to an inappropriate mounting position of the lens. Further, the manufacturing cost of the image sensor module is high because the mounting structure of the lens is complicated.

DISCLOSURE OF THE INVENTION

The present invention has been conceived under such a situation. Therefore, it is an object of the present invention to provide an image sensor module that is structured to facilitate accurate mounting of the lens. It is another object to provide a method for disposing the lens at an accurate position.

According to a first aspect of the present invention, an image sensor module is provided which comprises an image sensor chip mounted on a substrate, a housing installed on the substrate and having a step portion for retaining a lens above the image sensor chip, a lens unit placed on the step portion for forming an image of an object on the image sensor chip, and a lens retainer installed on the housing. The lens retainer comprises an elastically deformable portion, and the lens unit is pressed against the step portion of the housing by a biasing force caused by the elastically deformable portion.

Preferably, the lens retainer further comprises a first portion fixed to an upper face of the housing, and a second portion held in contact with an upper face of the lens unit. The elastically deformable portion is disposed between the first portion and the second portion.

Preferably, the first portion of the lens retainer is formed with a projection, and the upper face of the housing is formed with a recess for engagement with the projection.

Preferably, the lens retainer covers a portion of the upper face of the lens unit except for a predetermined central area of the lens unit.

Preferably, the lens unit includes an upper portion protruding above the upper face of the housing.

Preferably, the lens retainer includes an intermediate portion between the first portion and the second portion, and the intermediate portion is formed with a recess for thickness reduction.

Preferably, the lens unit comprises a combination of a first lens and a second lens. The first lens has a concave lens face, whereas the second lens member has a convex lens face that is spaced from the concave lens face.

Preferably, the first lens has a positioning projection, whereas the second lens has a recess for engagement with the positioning projection.

Preferably, the image sensor module according to the present invention further comprises an additional step portion located below the first-mentioned step portion, and an optical filter installed on the additional step portion.

According to a second aspect of the present invention, an image sensor module is provided which comprises: an image sensor chip mounted on a substrate; and a lens unit including a lens portion that faces the image sensor chip, and a spacer extending downward from the lens portion. The spacer directly contacts the image sensor chip.

Preferably, the spacer is fixed to the image sensor chip via an adhesive.

Preferably, the lens unit comprises a first lens integrated with the spacer and a second lens combined with the first lens.

Preferably, the image sensor module according to the present invention further comprises an optical filter that covers the lens portion of the lens unit.

Preferably, the image sensor module according to the present invention further comprises a diaphragm disposed between the lens unit and the optical filter.

According to a third aspect of the present invention, a method is provided for manufacturing an image sensor module. The method comprises the steps of mounting an image sensor chip on a substrate, and mounting a lens unit on the image sensor chip. The lens unit comprises a lens portion and a spacer extending from the lens portion. The spacer is brought into direct contact with the image sensor chip when the lens unit is mounted on the image sensor chip.

According to a fourth aspect of the present invention, a method is provided for manufacturing an image sensor module which comprises an image sensor chip mounted on a substrate and a lens unit having a lens face that faces the image sensor chip. The method comprises the steps of adjusting a distance between the image sensor chip and the lens face, and fixing the lens unit after the distance adjustment.

Preferably, the distance is adjusted by displacing the lens face while the image sensor chip is capturing an image of a test chart through the lens face, so that the captured image of the test chart becomes optimum.

Preferably, the lens unit is fixed by using ultraviolet curing resin.

Preferably, the distance is adjusted by moving a housing retaining the lens unit.

Preferably, the distance is adjusted by moving the lens unit relative to a housing fixed to the substrate.

BEST MODE FOR CARRYING OUT THE INVENTION

Embodiments of the present invention will now be described with reference to the accompanying drawings.

Figure 1:
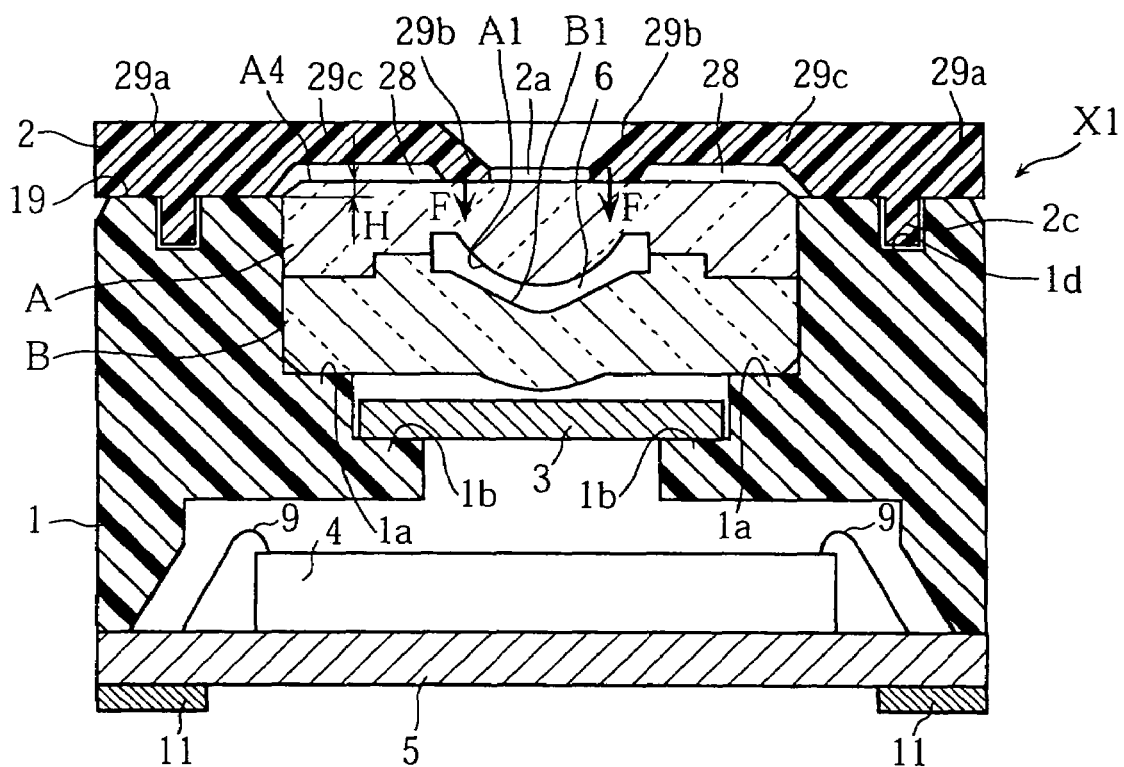
FIG. 1 is a cross-sectional view depicting the image sensor module according to a first embodiment of the present invention.

FIG. 1 shows an image sensor module X1 according to a first embodiment of the present invention. The image sensor module X1 comprises first and second lenses A and B, a housing 1, a lens retainer 2, an optical filter 3, an image sensor chip 4 and an insulating substrate 5.

Figure 4:
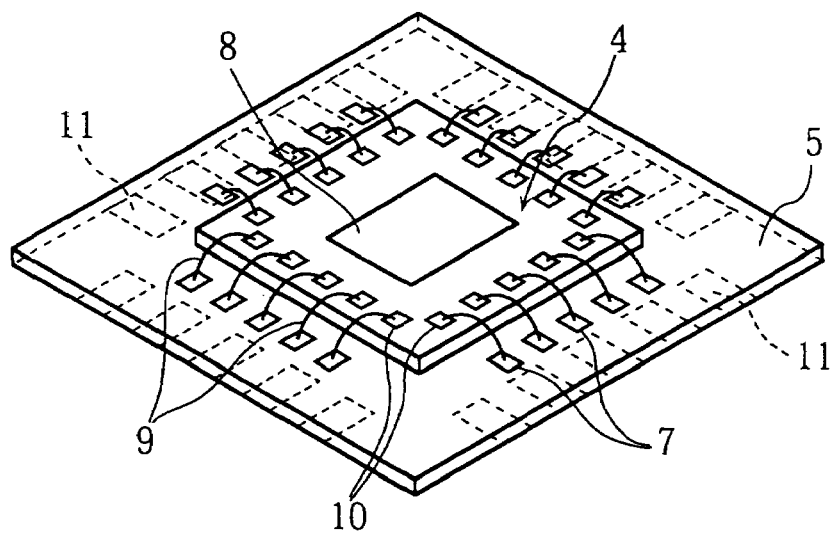
FIG. 4 is a perspective view depicting the image sensor chip to be used for the image sensor module in FIG. 1.

The substrate 5 is a rectangular plate. The image sensor chip 4 is a CCD type or a CMOS type solid image sensing device, and is mounted on the substrate 5. As FIG. 4 shows, the image sensor chip 4 comprises a light receiving section 8 for receiving light, a plurality of electrodes 10 and a photo-electric conversion section (not illustrated) which is built inside. The light received by the light receiving section 8 is converted into electric charges corresponding to the received light quantity by the photo-electric conversion section. The electric charges are output from the electrodes 10. The electrodes 10 are connected to a plurality of conductor pads 7 formed on the surface of the substrate 5 via wires 9. A plurality of terminals 11, which are electrically conducted with the conductor pads 7 via a wiring pattern (not illustrated), are disposed on the rear face of the substrate 5. Surface mounting of the image sensor module X1 (FIG. 1) is possible via the plurality of terminals 11.

The housing 1 is made of synthetic resin that shields light, for example, and has a cylindrical outer wall face. The housing 1 is fixed to the substrate 5 so as to surround the image sensor chip 4. The housing 1 is fixed in this state using an adhesive containing ultraviolet curing resin, for example. Due to this, the adhesive can be quickly hardened by irradiating ultraviolet.

The housing 1 has an accommodating space inside for receiving the first and second lenses A, B together the optical filter 3. The housing 1 is internally provided with first and second step portions 1a, 1b. The first step portion 1a is a part for supporting the first and second lenses A, B. The second step portion 1b is a part for supporting the optical filter 3, and is formed below the first step portion 1a. The optical filter 3 shields the infrared contained in the light which transmits through the first and second lenses A, B. Due to this, a clear image with very little noise can be captured.

Figure 2:
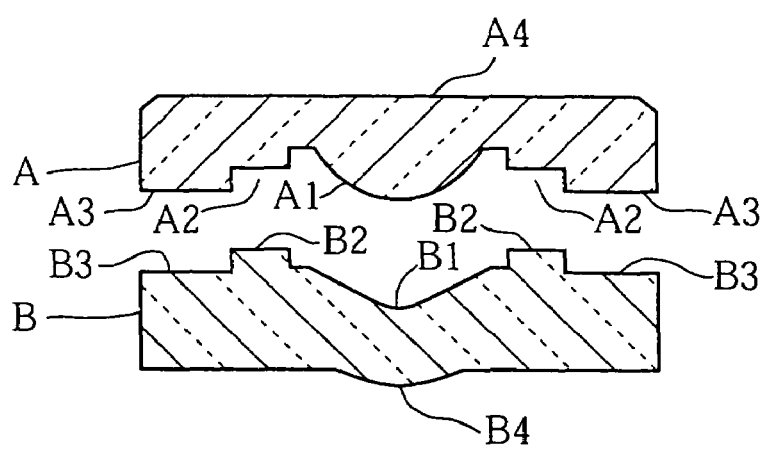
FIG. 2 is an exploded view depicting the lens unit to be used for the image sensor module in FIG. 1.

The first and second lenses A, B are discal and have the same diameter for focusing the light traveling from the object to the light receiving section 8 of the image sensor chip 4. As FIG. 2 shows, the first lens A is a plano-convex lens. Specifically, while the entire upper face A4 of the lens A is flat, the center of the bottom face is formed as a convex lens A1. The second lens B is a concave/convex lens. Specifically, the center of the upper face of the lens B is formed as a concave lens face B1 and the center of the bottom face is formed as a convex lens face B4. The bottom face of the first lens A includes a circular recess A2 surrounding the lens face A1, and a flat section A3 surrounding the recess A2. The upper face of the second lens B includes a projection B2 surrounding the lens face B1 and a flat section B3 surrounding the projection B2.

The first and second lenses A, B are overlaid so that the flat sections A3, B3 come into contact with each other. As FIG. 1 shows, a part of the lens face A1 is inserted into the concave portion defined by the lens face B1, and a gap 6 is created between the lens faces A1, B1. The projection B2 is fitted in the recess A2. By such fitting, the first and second lenses A, B are coaxially aligned. A lens unit comprising the first and second lenses A, B is placed on the first step portion 1a. As FIG. 1 shows, the lens B is entirely housed in the housing 1, but the lens A protrudes beyond the upper face 19 of the housing 1 by an amount H.

The lens retainer 2 is made of synthetic resin, and has a central opening 2a. The lens retainer 2 is fixed to the housing 1 with its outer edge 29a overlaid onto the upper face 19 of the housing 1. The bottom face of the outer edge 29a is formed with a plurality of projections 2c for insertion into a plurality of recesses 1d formed on the upper face 19 of the housing 1. By such insertion, the lens retainer 2 is positioned with respect to the housing 1. The housing 1 and the lens retainer 2 bonded to each other via an adhesive.

Figure 3:
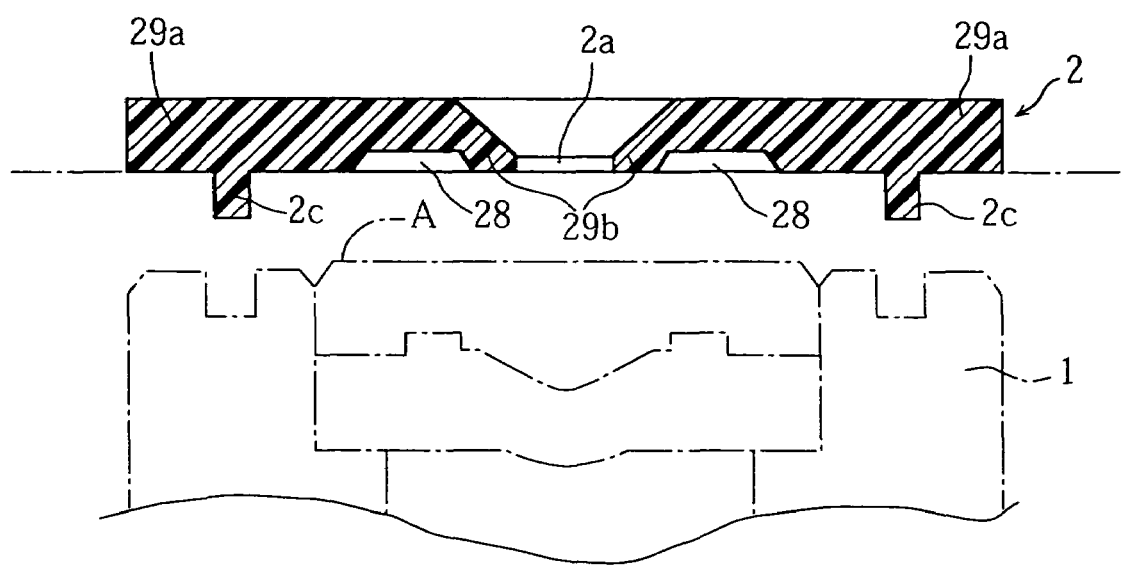
FIG. 3 is a cross-sectional view depicting the lens retainer to be used for the image sensor module in FIG. 1.

The inner edge 29b of the lens retainer 2 is held in contact with the upper face A4 of the first lens A, and generates a pressing force F downward to the first and second lenses A, B. FIG. 3 shows the lens retainer 2 in the state ("natural state") where it is not mounted to the housing 1. In the natural state, the bottom face of the inner edge 29b and the bottom face of the outer edge 29a are positioned on the same plane. As described above, the upper face A4 of the first lens A protrudes beyond the upper face 19 of the housing 1 by the amount H. Therefore, in the state where the lens retainer 2 is installed in the housing 1, the mid-portion 29c of the housing 1 is elastically deflected to generate a pressing force F, as described above.

The mid-portion 29c of the lens retainer 2 is formed to be thinner than the outer edge 29a. Therefore, a gap 28 is created between the mid-portion 29c and the lens A. (In other words, a recess is formed in the mid-portion 29c.) By such a design, the mid-portion 29c can be appropriately deflected. The lens retainer 2 covers an area of the upper face A4 of the first lens A other than a predetermined central area. The upper face A4 of the first lens A is upwardly exposed only at a portion only corresponding to the opening 2a of the lens retainer 2, and this prevents excess light, unnecessary for forming an image of the object, from entering into the first and second lenses A, B.

Now, the operation of the image sensor module X1 will be described.

In this image sensor module X1, the lens retainer 2 generates a pressing force F due to the elastic deformation of the mid-portion 29c thereof, and by this pressing force F the first and second lenses A, B are pressed against the upper face of the first step portion 1a. Therefore, the first and second lenses A, B do not rise unexpectedly from the first step portion 1a. According to this configuration, the first and second lenses A, B can be kept accurately at a desired height from the upper face of the first step portion 1a as a reference surface.

According to the present embodiment, since the first and second lenses A, B are used in combination, it is possible to decrease aberration while increasing the numerical aperture, compared with the case of using a single lens. In other words, bright and clear images with low distortion can be captured. Also according to the present embodiment, infrared is shielded by the optical filter 3, and the lens retainer 2 covers an area of the upper face A4 of the first lens A other than the central area. Due to this configuration, the quality of captured images can be improved.

The lens retainer 2 functions as a means for generating a lens pressing force F, and also as a diaphragm for the lens. Therefore, it is possible to decrease the number of components of the image sensor module X1. Further, the module X1 also has a simple structure, which contributes to a reduction of the manufacturing cost.

Figure 5:
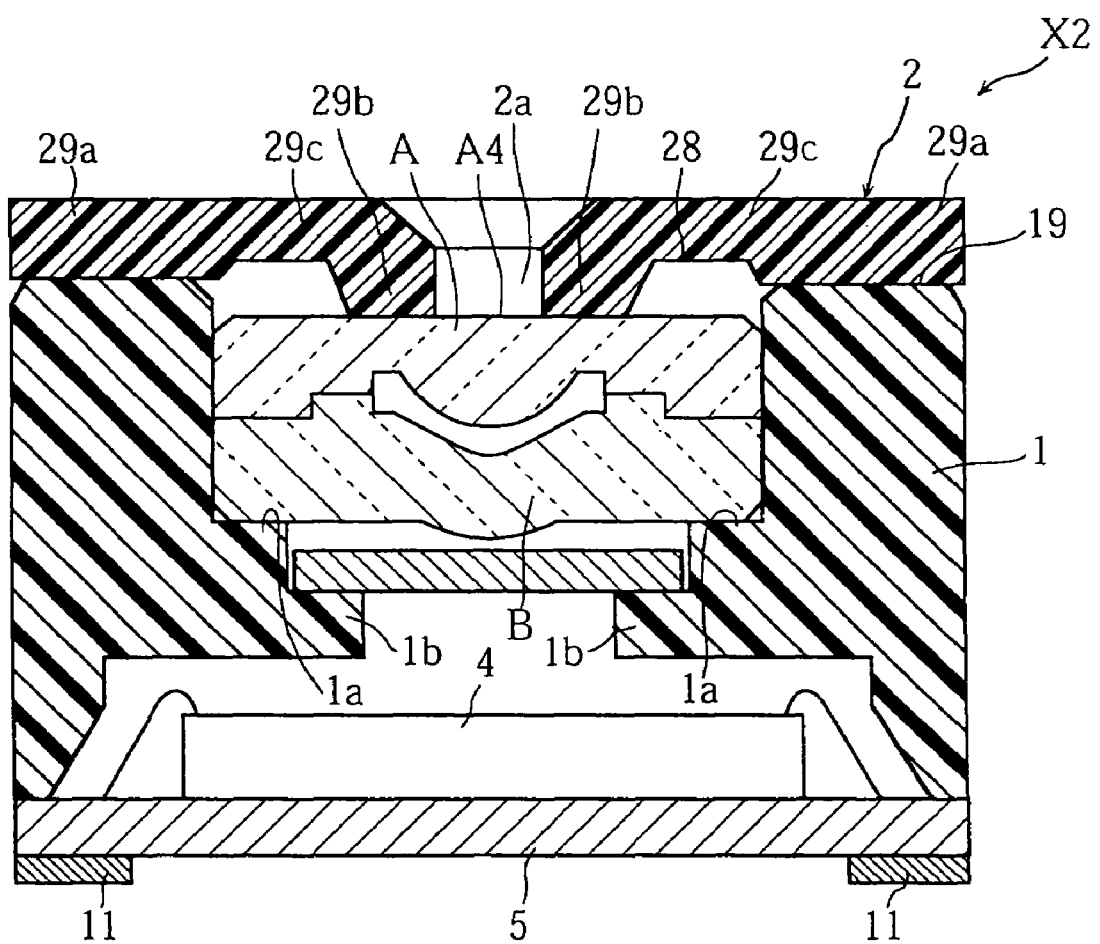
FIG. 5 is a cross-sectional view depicting an image sensor module according to a second embodiment of the present invention.

FIG. 5 shows a second embodiment of the present invention. In FIG. 5, the elements which are identical or similar to those of the first embodiment module are denoted with the same reference numerals. The module X2 shown in FIG. 5 essentially has the same structure as the module X1 shown in FIG. 1, but differs therefrom in the following aspects. In the module X1 shown in FIG. 1, the upper portion of the first lens A protrudes beyond the upper face 19 of the housing 1, but in the module shown in FIG. 5, the first lens A is housed in the housing 1 in a manner such that the upper face A4 thereof is lower than the upper face 19 of the housing 1. In this case as well, the lens unit can be pressed downward by bringing the inner edge 29b of the lens retainer 2 into contact with the upper face A4 of the lens A.

According to the present invention, the upper face A4 of the first lens A may be located on a same plane as the upper face 19 of the housing 1. The lens retainer 2 may comprise a cylindrical section for fitting over the housing 1.

An image sensor module (X3: see FIG. 8) according to a third embodiment of the present invention will now be described with reference to FIG. 6 to FIG. 8.

In the first and second embodiments, the lens unit is accurately positioned by using the biasing force of the lens retainer 2. However, if the following method is used, the lens unit can be accurately positioned with respect to the image sensor chip without using such a lens retainer.

Figure 6:
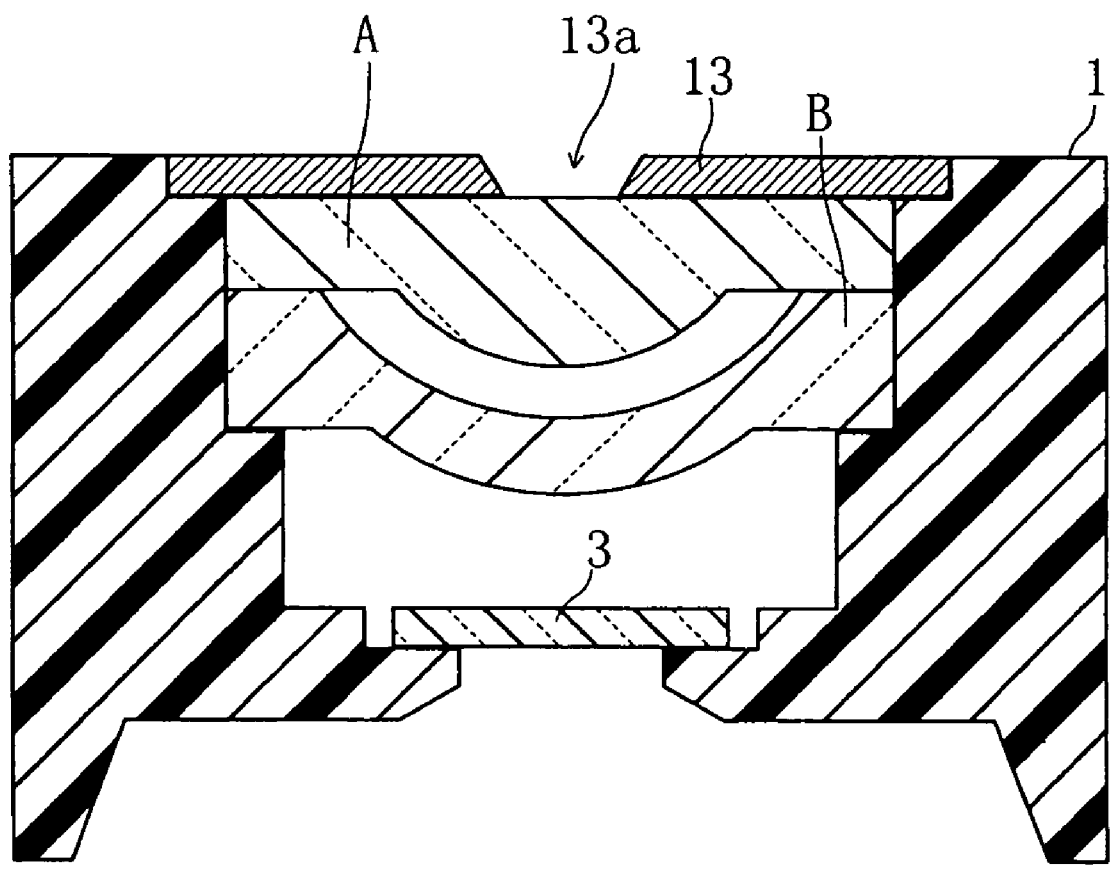
FIG. 6 is a cross-sectional view depicting the major unit of the image sensor module according to a third embodiment of the present invention.

As FIG. 6 shows, the module according to the third embodiment includes a housing 1, which is similar to the housing shown, in FIG. 5. The housing 1 fixedly receives an optical filter 3 together with first and second lenses A and B. The upper face of the first lens A is provided with a diaphragm 13. The diaphragm 13 is provided with an opening 13a for transmitting light. The unit shown in FIG. 6 will be referred to as "lens assembly" herein below.

Figure 7:
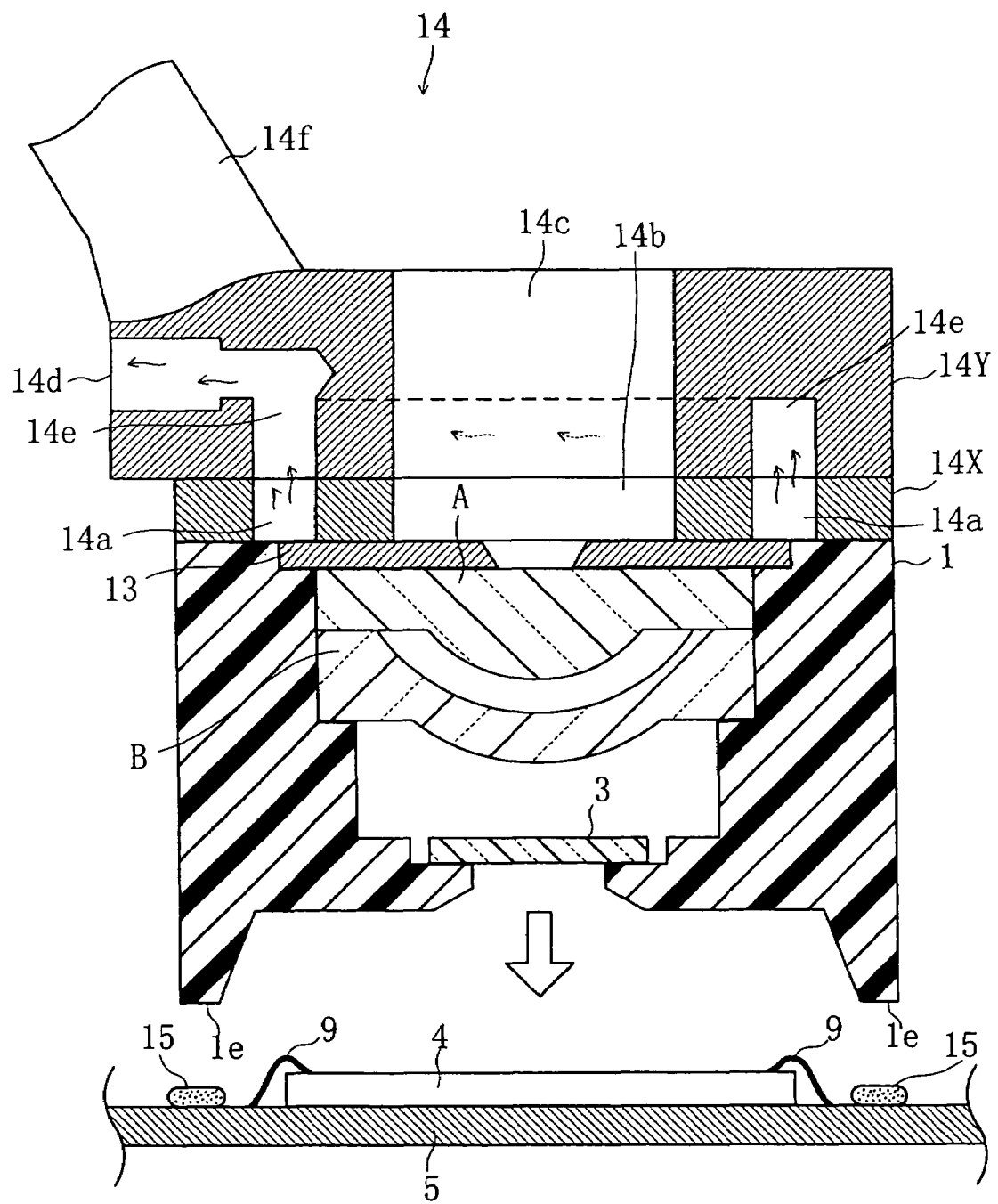
FIG. 7 and FIG. 8 are diagrams depicting a method of fixing the unit in FIG. 6 to the substrate.

As FIG. 7 shows, the lens assembly is fixed to the substrate 5 by using the handling device 14 as follows.

First, the upper face of the lens assembly is sucked up and held by the handling device 14. In this state, the lens assembly is caused to approach the upper face of the substrate 5 above the image sensor chip 4. A predetermined area of the upper face of the substrate 5 is coated in advance with ultraviolet curing resin 15 that hardens quickly.

The handling device 14 comprises a suction unit 14X and a main unit 14Y in addition to a non-illustrated vacuum pump and a non-illustrated drive mechanism. The suction unit 14X is formed with many suction holes 14a for intimately contacting the upper face of the lens assembly under suction. The suction unit 14X is also formed with a central opening 14b for capturing the image of a later-mentioned test chart on the image sensor chip 4 via the diaphragm 13, lenses A and B and optical filter 3. For the same purpose, the main unit 14Y as well is formed with a center opening 14c while also incorporating a groove 14e providing a channel from a connection port 14d for the vacuum pump to the suction ports 14a of the section unit 14X, and an arm 14f for linking to the drive mechanism. The suction unit 14X and the main unit 14Y are integrated so as to connect the center openings 14b, 14c with each other while also connecting the suction ports 14a with the groove 14e. In use of the thus designed handling device 14, if the vacuum pump is activated with the suction ports 4a held in contact with the upper face of the lens assembly, air flows from the suction ports 14a to the connection port 14d via the groove 14e to generate a negative pressure near the suction ports 14a, so that the lens assembly is sucked up and held. The suction unit 14X and the main unit 14Y holding the lens assembly under suction are moved to a predetermined position above the image sensor chip 4 by the drive mechanism via the arm 14f, and then moved downward. As a result, the bottom 1e of the housing 1 sinks into the ultraviolet curing resin 15.

Figure 8:
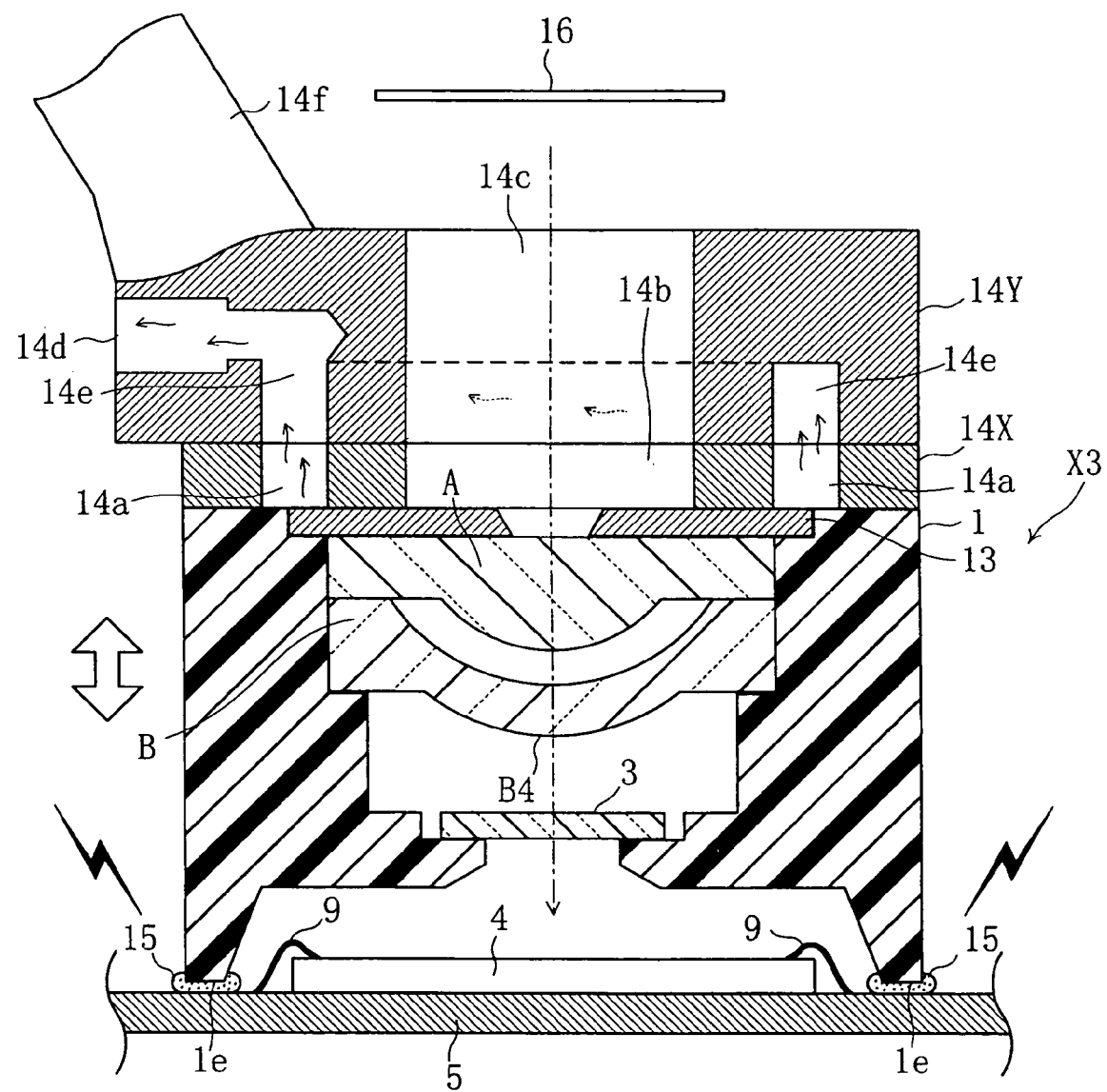

Then, as FIG. 8 shows, the entire lens assembly is finely moved vertically for focus adjustment, using a test chart 16. While holding the lens assembly at the best focus position, the ultraviolet curing resin 15 is caused to harden in this state.

More specifically, after the bottom 1e of the housing 1 sinks into the ultraviolet curing resin 15, the test chart 16 is positioned above the main unit 14Y. The test chart 16 is fixed at a predetermined distance away from the image sensor chip 4. The test chart 16 carries a pattern for focus adjustment.

Normally, the convex lens face B4 of the second lens B is not located at the best focus position relative to the image sensor chip 4 in the initial stage. Therefore, with the image sensor chip 4 activated, an image of the test chart 16 is captured by the image sensor chip 4 while vertically displacing the convex lens face B4. In this way, the output signals of the image sensor chip 4 are taken out to display the captured image of the test chart 16 on a non-illustrated monitor. The captured image thus obtained is utilized to detect the best focusing position ("optimum position") of the lens assembly for the test chart 16. Then, the lens assembly is fixed at the detected optimum position. By irradiating ultraviolet onto the ultraviolet curing resin 15 in this state, the ultraviolet curing resin 15 is caused to harden. For complete hardening of the ultraviolet curing resin 15, the ultraviolet irradiation may be followed by heating. After the hardening of the ultraviolet curing resin 15, the suction operation of the handling device 14 is stopped so as to release the suction unit 14X and the main unit 14Y from the lens assembly.

According to the above method, the lens assembly can be disposed at a position where a clear image can be captured.

Figure 9:
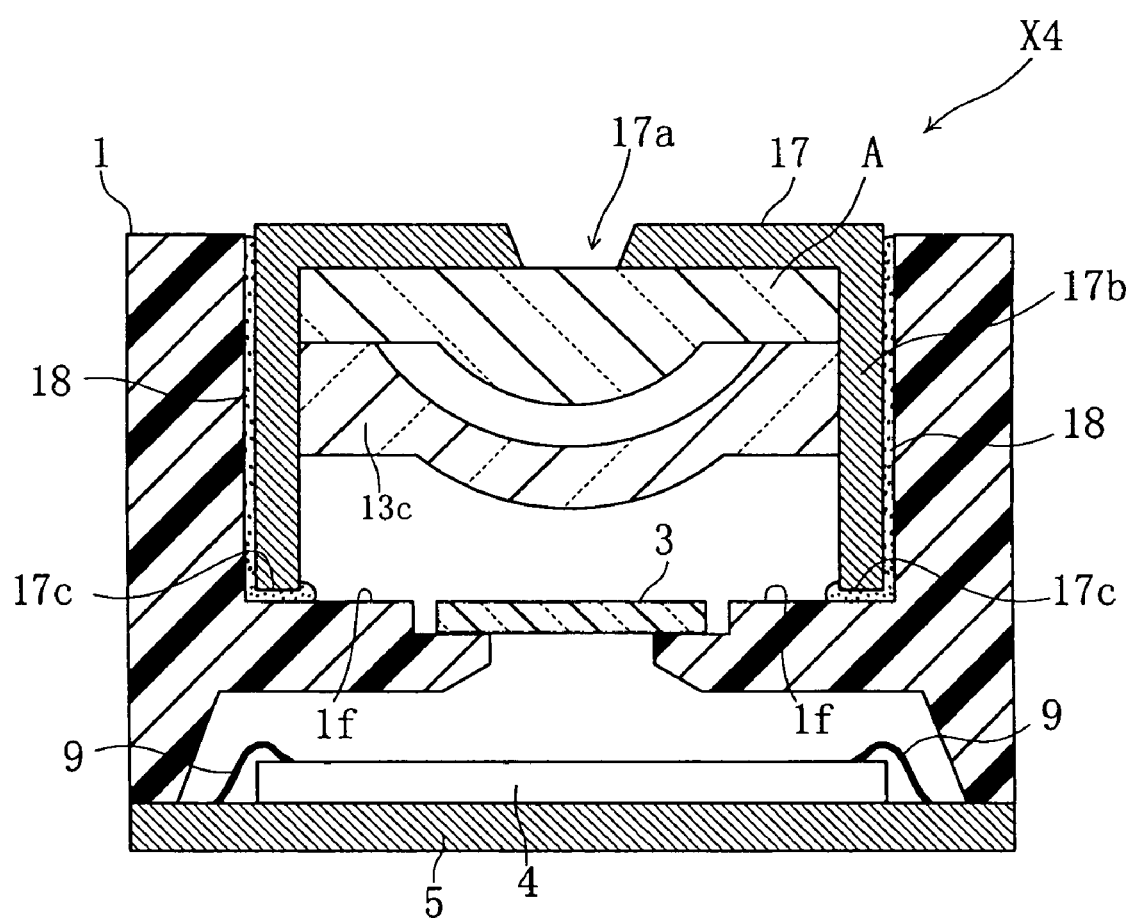
FIG. 9 is a cross-sectional view depicting the image sensor module according to a fourth embodiment of the present invention.

FIG. 9 shows an image sensor module X4 according to a fourth embodiment. In FIG. 9, the elements identical or similar to those of the third embodiment are denoted with the same reference numerals. The image sensor module X4 comprises a first lens A, a second lens B, a housing 1, an optical filter 3, an image sensor chip 4 and a substrate 5. The image sensor module X4 also includes a lens cap 17 for retaining the pair of lenses A and B.

As FIG. 9 shows, the lens cap 17 has a top wall formed with an opening 17a for transmitting light onto the upper surface, thereby functioning as a diaphragm. The lens cap 17 also has a cylindrical side wall 17b. The bottom of the side wall 17b is indicated by the reference symbol 17c.

The first and second lenses A, B and the lens cap 17 are assembled highly precisely. The lens cap 17 is inserted into the cylindrical housing space formed in the housing 1, and is fixed to the housing 1 via an adhesive 18. The housing 1 is internally formed with a flat section 1f that faces the bottom 17C of the lens cap 17.

In manufacturing the image sensor module X4, focus adjustment is performed using a handling device, as in the case of making the module X3 of the third embodiment. The details will be described below.

Figure 10:
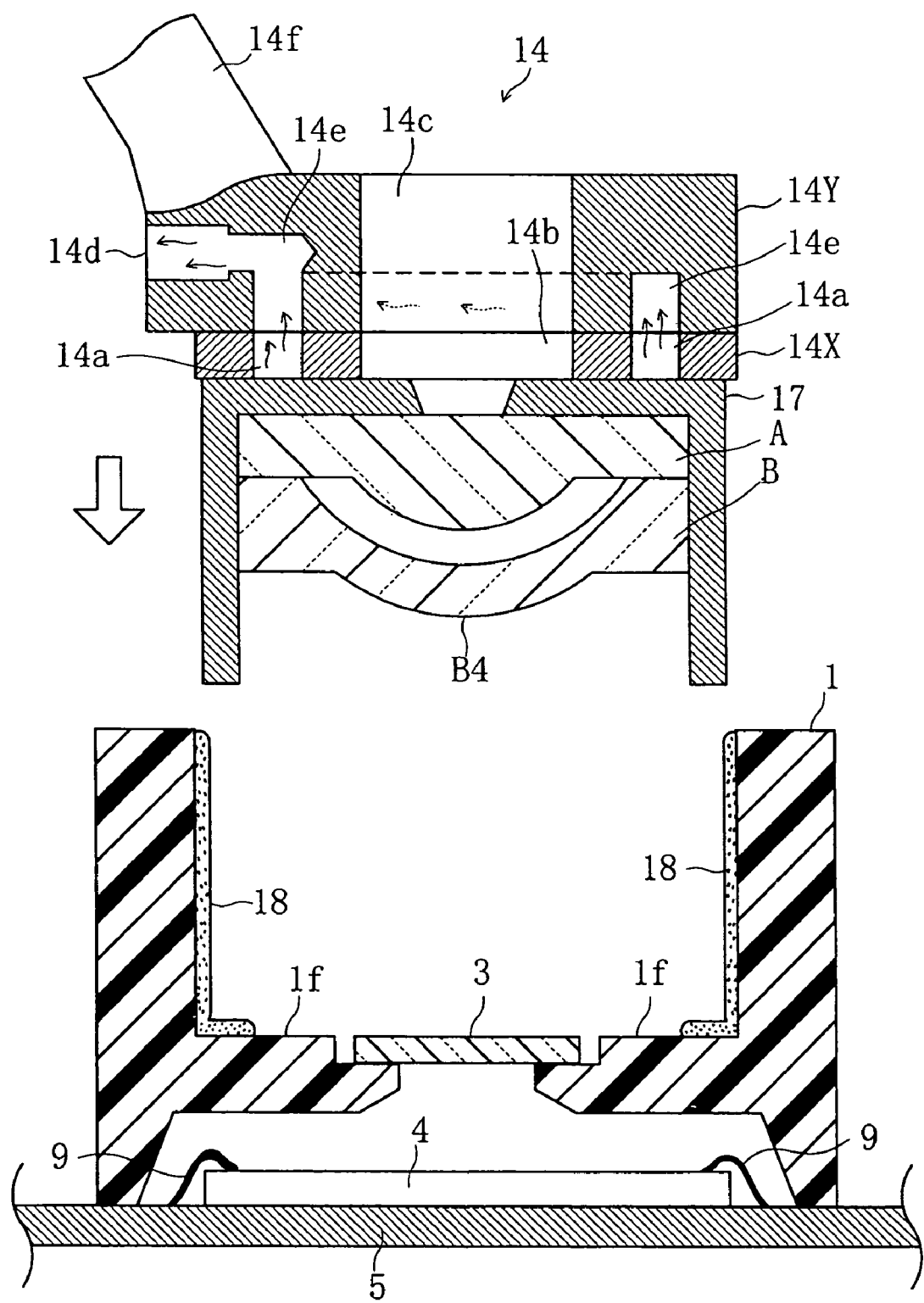
FIG. 10 and FIG. 11 are diagrams depicting a method for fixing the lens unit of the image sensor module in FIG. 9 to the housing.

As FIG. 10 shows, the upper face of the lens cap 17 is held by the handling device 14 under suction. The lenses A, B are fixed to the lens cap 17 in advance. The device 14 shown in FIG. 10 has the same structure and functions as the handling device shown in FIG. 7. The image sensor chip 4 is mounted on the substrate 5, and the chip 4 is connected via the wires 9 to the wiring pattern (not illustrated) formed on the substrate 5. The housing 1 is fixed on the substrate 5. The optical filter 3 is installed on the housing 1. The ultraviolet curing resin 18, for securing the lens cap 17, is coated at predetermined portions of the housing 1.

By moving the handling device 14 from the position shown in FIG. 10, the lens cap 17 is inserted into the housing space of the housing 1.

Figure 11:
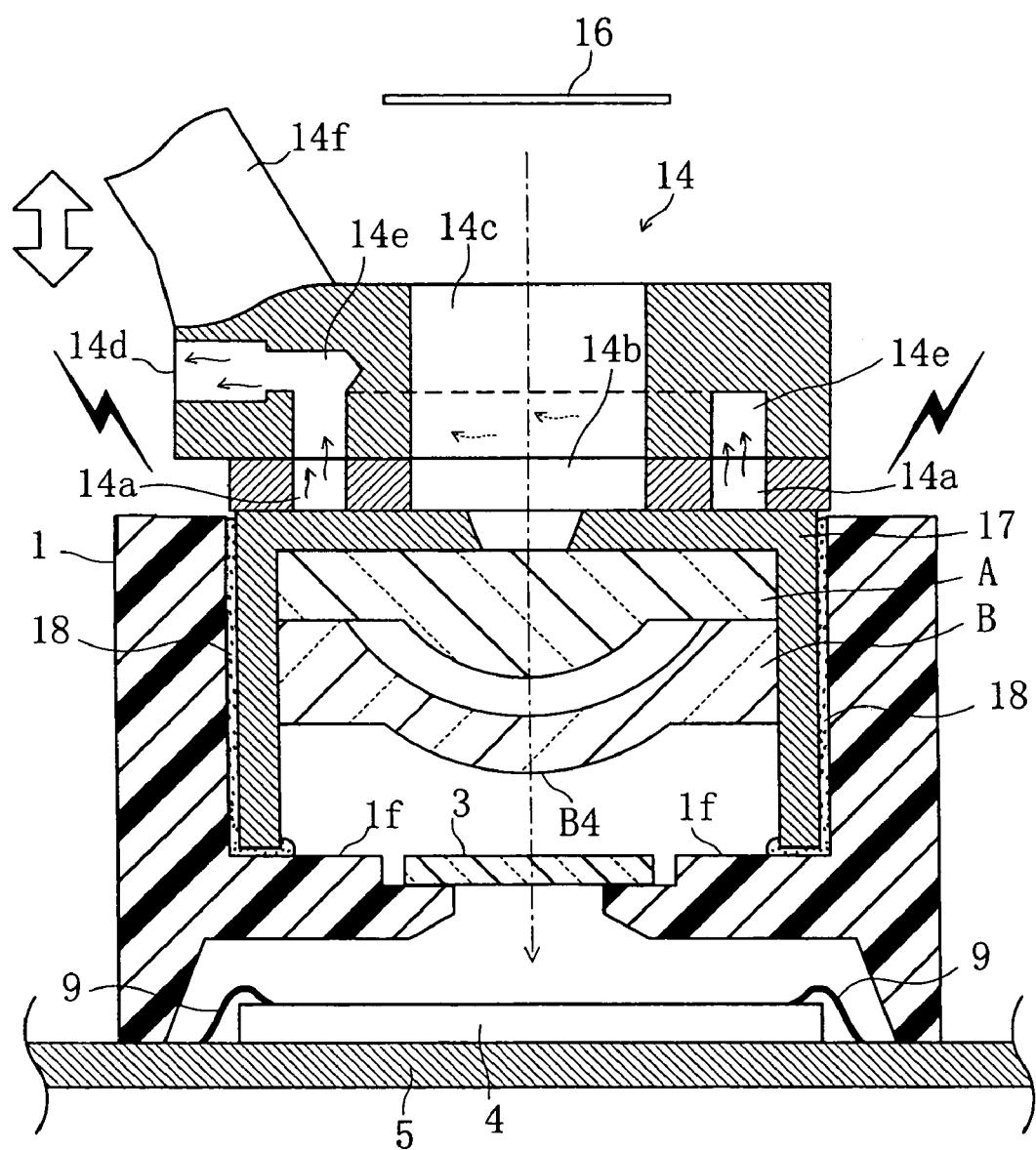

Then, as FIG. 11 shows, by displacing the lens cap 17 vertically, a position is detected at which the clearest captured image is obtained. For this purpose, use is made of the test chart 16, as in the case of the third embodiment.

When the optimum focus position is determined, the movement of the handling device 14 is stopped, and the ultraviolet curing resin 18 is hardened by irradiating ultraviolet. As a result, the distance between the lens face B4 of the lens B and the image sensor chip 4 can be optimized.

Figure 12:
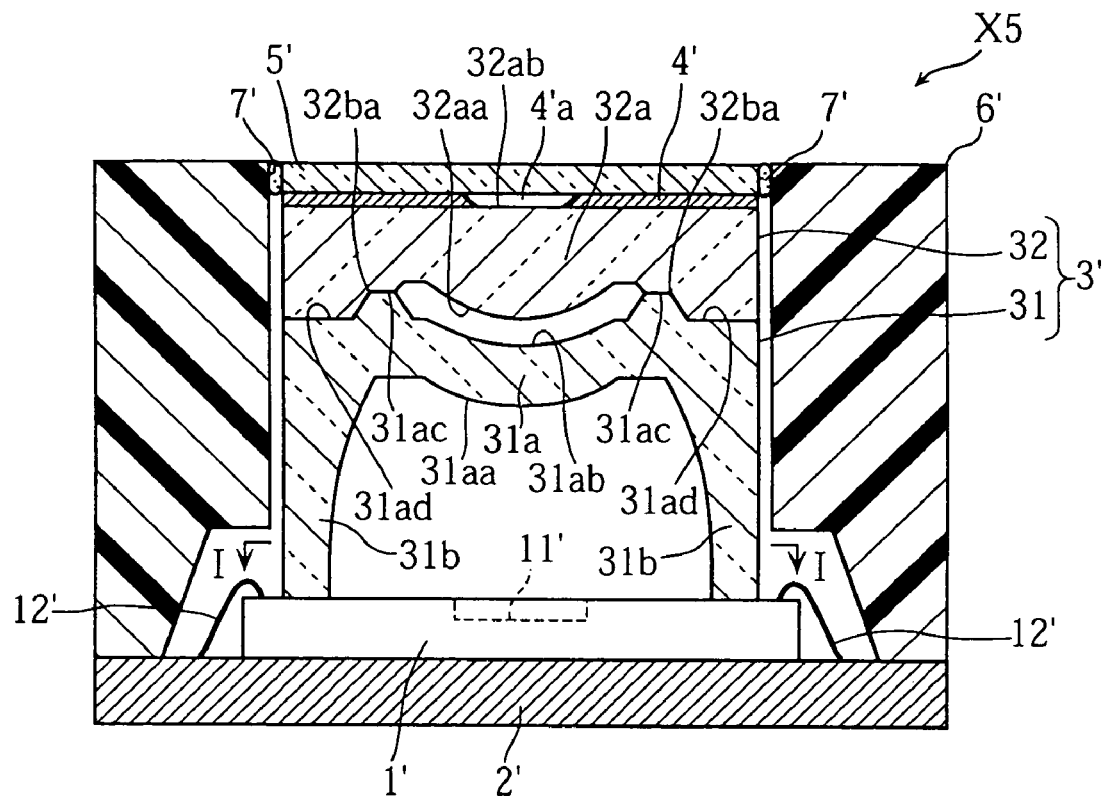
FIG. 12 is a cross-sectional view depicting the image sensor module according to a fifth embodiment of the present invention.

FIG. 12 shows an image sensor module X5 according to a fifth embodiment. The image sensor module X5 comprises an image sensor chip 1', a substrate 2' on which the image sensor chip 1' is mounted, a lens unit 3', a diaphragm 4' disposed on the lens unit 3', an optical filter 5' disposed on the diaphragm 4', and a housing 6' surrounding the lens unit 3'. The lens unit 3' is a combination of the first and second lenses 31, 32.

The image sensor chip 1' is a CCD type or CMOS type solid image sensing device. The upper face of the image sensor chip 1' is centrally provided with a light receiving section 11' for receiving light which transmits through the lens unit 3'. The image sensor chip 1' is electrically connected to lands (not illustrated) on the substrate 2' via a plurality of wires 12'. The image sensor chip 1' outputs signals to the outside via the wires 12' according to the quantity of light received by the light receiving section 11'. The output signals are used as pixel information via an A/D converter and an image processor.

The substrate 2' is a printed circuit board, for example. The bottom face of the substrate 2' is provided with a plurality of terminals (not illustrated) for conduction to the lands. Such conduction may be realized by forming through-holes on the substrate 2', for example.

The lens unit 3' comprises a first one-piece lens 31 which is disposed directly above the image sensor chip 1', and a second one-piece lens 32 fixed on the first lens 31. Each of the lenses 31, 32 is made of transparent synthetic resin, for example, and has the lens section 31a, 32a respectively.

Figure 13:
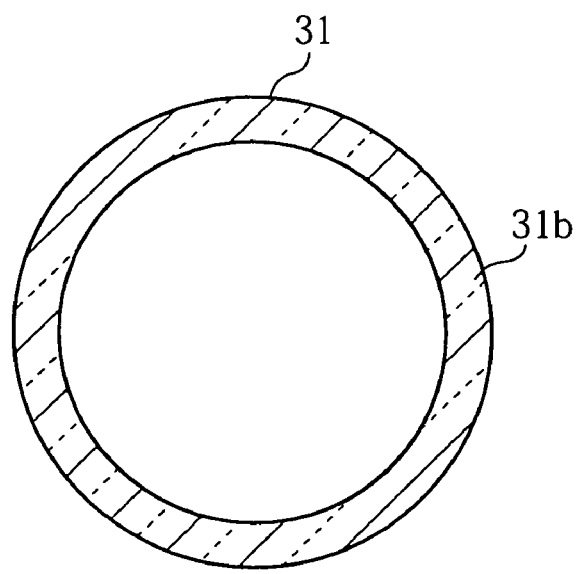
FIG. 13 is a cross-sectional view taken along lines I-I in FIG. 12.

In addition to the lens section 31a, the first lens 31 has a spacer 31b which extends from the edge of the lens section 31a into contact with the image sensor chip 1'. As FIG. 13 shows, the spacer 31b is cylindrical. The lens section 31a comprises a convex lens face 31aa facing the image sensor chip 1' side, and a concave lens face 31ab opposite to the convex lens surface. Around the concave lens surface 31ab is disposed an upwardly directed protrusion 31ac. The protrusion 31ac is surrounded by a flat section 31ad. The spacer 31b is located under the flat section 31ad. The spacer 31b has a tip bonded to the upper face of the image sensor chip 1' outside the light receiving section 11' via an adhesive. If the spacer 31b is accurately formed to have a predetermined length, the height of the lens section 31a, with respect to the chip 1', can be accurately set simply by adhesively attaching the spacer 31b onto the image sensor chip 1'.

The second lens 32 comprises a lens section 32a and a peripheral section 32b which is roughly equal in thickness to the lens section 32a. The lens section 32a has a convex lens face 32aa facing the lens section 31a of the first lens 31, and a flat incident lens face 32ab at the opposite side of the first lens 31. The peripheral section 32b is formed with a stepped portion 32ba which comes into contact with the protrusion 31ac of the first lens 31 and the flat section 31ad. Since the second lens 32 contacts the first lens 31, the position of the lens section 32a with respect to the image sensor chip 1' can be accurately determined.

According to the above structure, the entire lens unit 3' is accurately positioned with respect to the image sensor chip 1'. As a result, the light coming from the object is accurately focused on the image sensor chip 1' via the lens unit 3'.

The diaphragm 4' is disposed for limiting light entry to the lens unit 3', and has an opening 4'a for transmitting light. The diaphragm 4' may be formed by coating a light shielding material on the upper face of the lens 32.

The optical filter 5' covers the entire diaphragm 4'. As FIG. 12 shows, the filter 5' is fixed to the housing 6' via an adhesive 7'. The filter 5' functions to shield infrared, for example. By removing infrared from the light coming from the object, a clear image is captured. The filter 5' also functions as a protective cover for the diaphragm 4' and the lens unit 3'. Specifically, the diaphragm 4' protects the lens unit 3' against dirt attachment or shock application, for example. Further, the filter 5' fixed to the housing 6' prevents the lens unit 3' from moving away from the image sensor chip 1'.

The housing 6' is made of light-shielding synthetic resin, for example, and has a cylindrical shape for covering the image sensor chip 1' and the lens unit 3'. The housing 6' is bonded to the substrate 2'. The housing 6' prevents light from leaking through the side face of the lens unit 3'. Further, the housing 6' prevents the lens unit 3' from shifting laterally due to shocks, for example.

The image sensor module X5 may be manufactured as follows.

Figure 14:
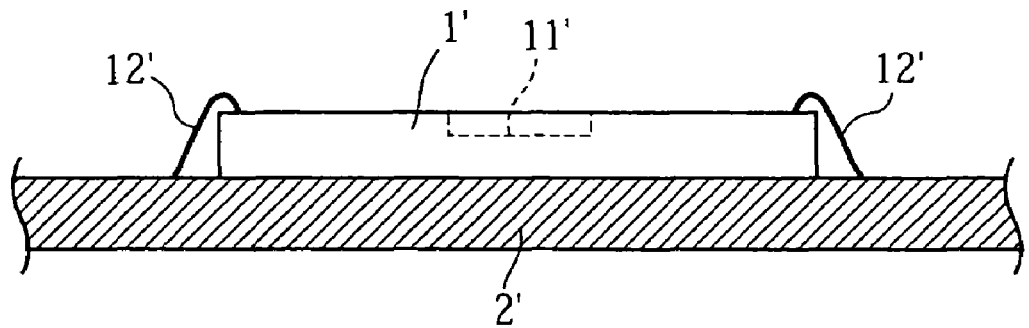
FIG. 14 to FIG. 16 are diagrams depicting a manufacturing method for the image sensor modulate in FIG. 12.

As FIG. 14 shows, after the image sensor chip 1' is mounted on the substrate 2', the chip 1' and the wiring pattern on the substrate are connected via the wires 12' by wire bonding.

Figure 15:
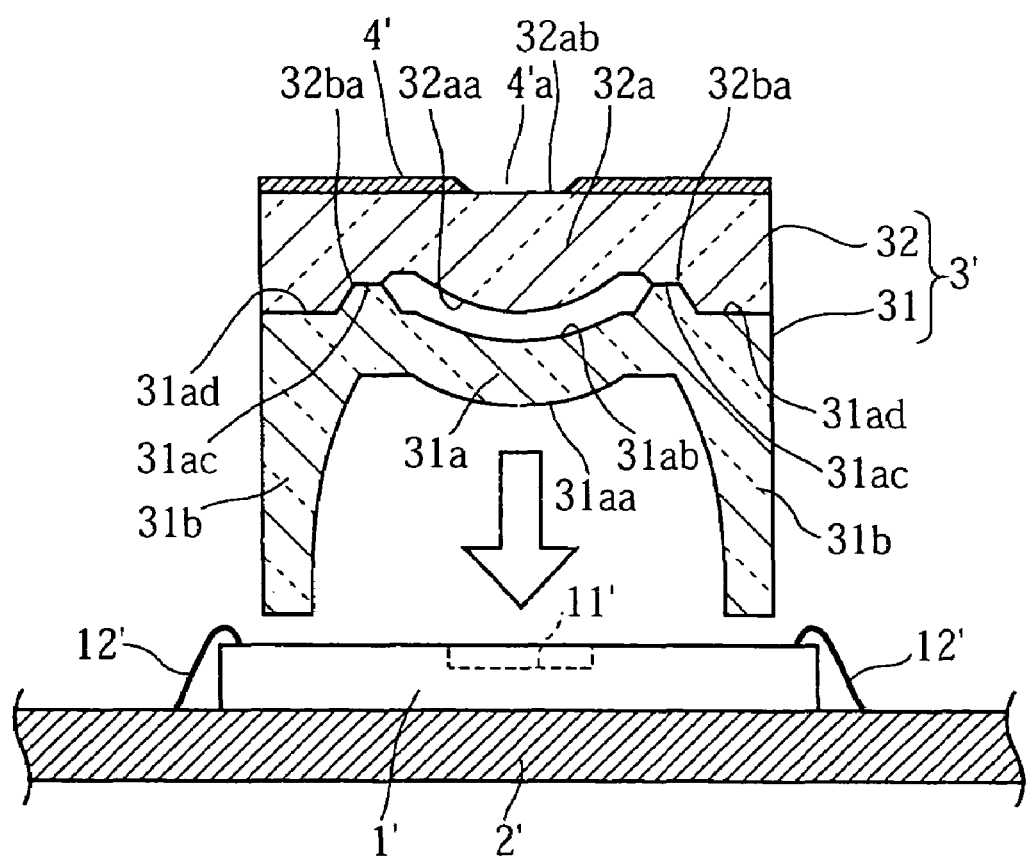

Then, as FIG. 15 shows, the lens unit 3' is directly mounted on the image sensor chip 1' (the diaphragm 4' is formed in advance on the upper face of the lens unit 3'). The bottom end of the spacer 31b is fixed to the upper face of the image sensor chip 1' via an adhesive. When the lens unit 3' is mounted on the chip 1', positional adjustment is performed so that the lens sections 31a, 32a are axially aligned with the light receiving section 11'.

Figure 16:
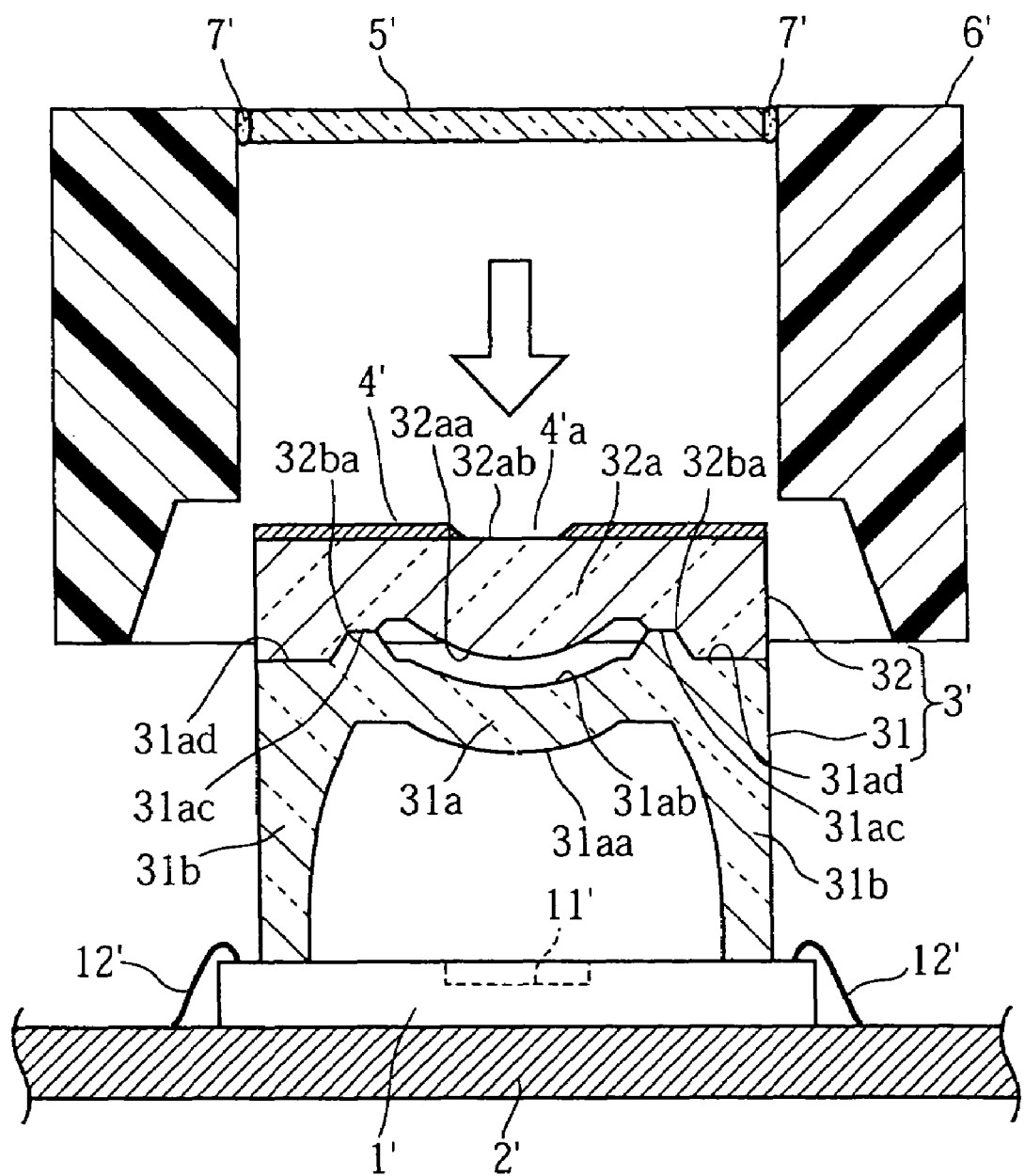

Finally, as FIG. 16 shows, the housing 6' is bonded to the substrate 2'. The optical filter 5' has been installed on the housing 6' in advance. When the housing 6' is bonded on the substrate 2', the filter 5' comes into intimate contact with the diaphragm 4'. Therefore, even if the lens unit 3' initially rises somewhat from the image sensor chip 1', the unit 3' is pressed toward the chip 1' by the filter 5'. After fixing the housing 6' to the substrate 2', the height of the lens sections 31a, 32a is set to a respective predetermined value.

Figure 17:
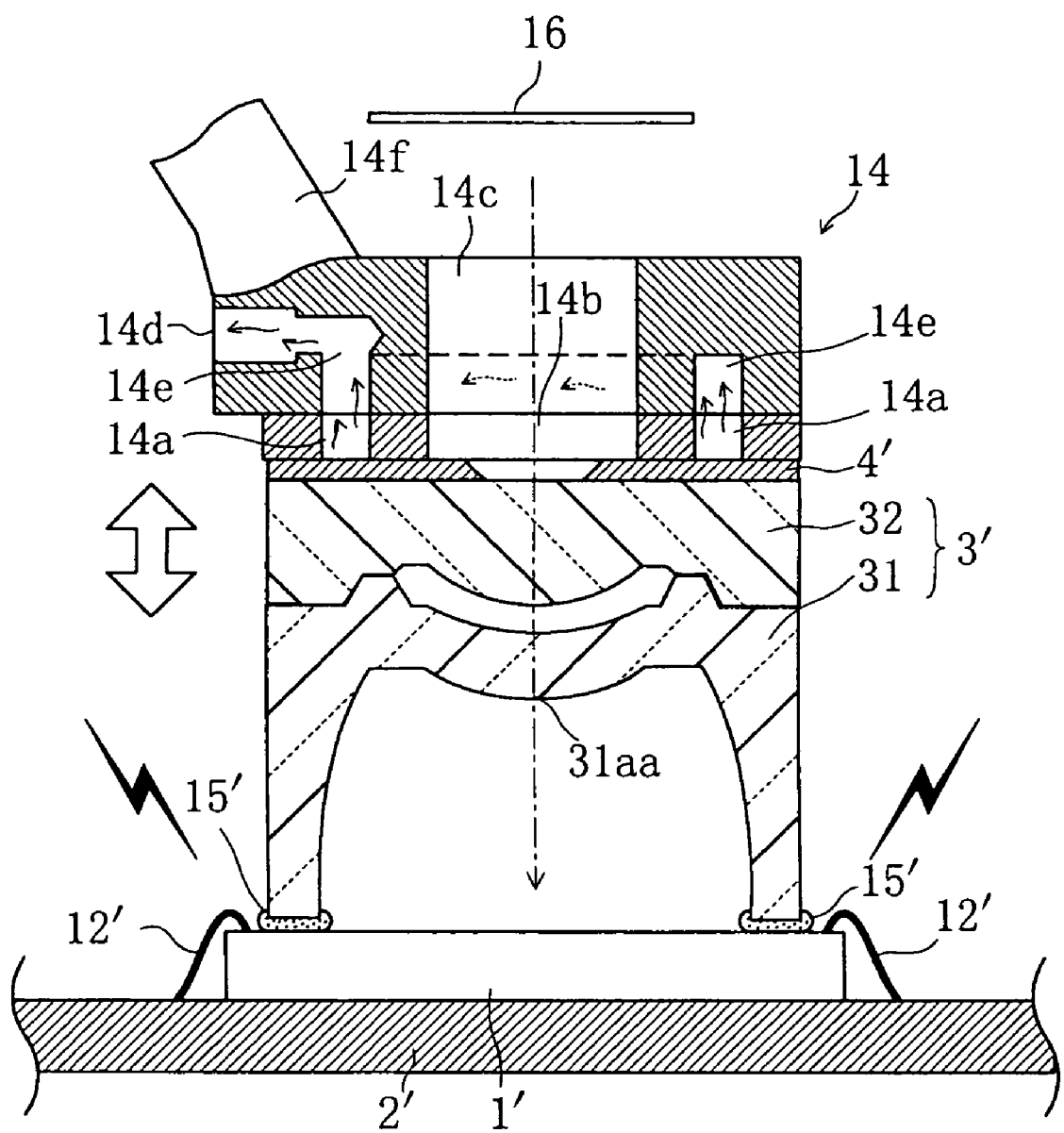
FIG. 17 is a diagram depicting an example of method for fixing the lens unit in FIG. 15 to the image sensor chip.

Focus adjustment using a handling device may also be adopted with respect to the fifth embodiment. Specifically, as FIG. 17 shows, the lens unit 3' is moved vertically by the handling device 14 in fixing the lens unit 3' to the image sensor chip 1'. At this time, focusing is performed using a test chart 16, as with the third and fourth embodiments. If the optimum focusing position is discovered, the movement of the handling device 14 is stopped, and ultraviolet curing resin 15' is hardened by irradiating ultraviolet. As a result, the distance between the lens face 31aa of the lens 31 and the image sensor chip 1' can be optimized.

Figure 18:
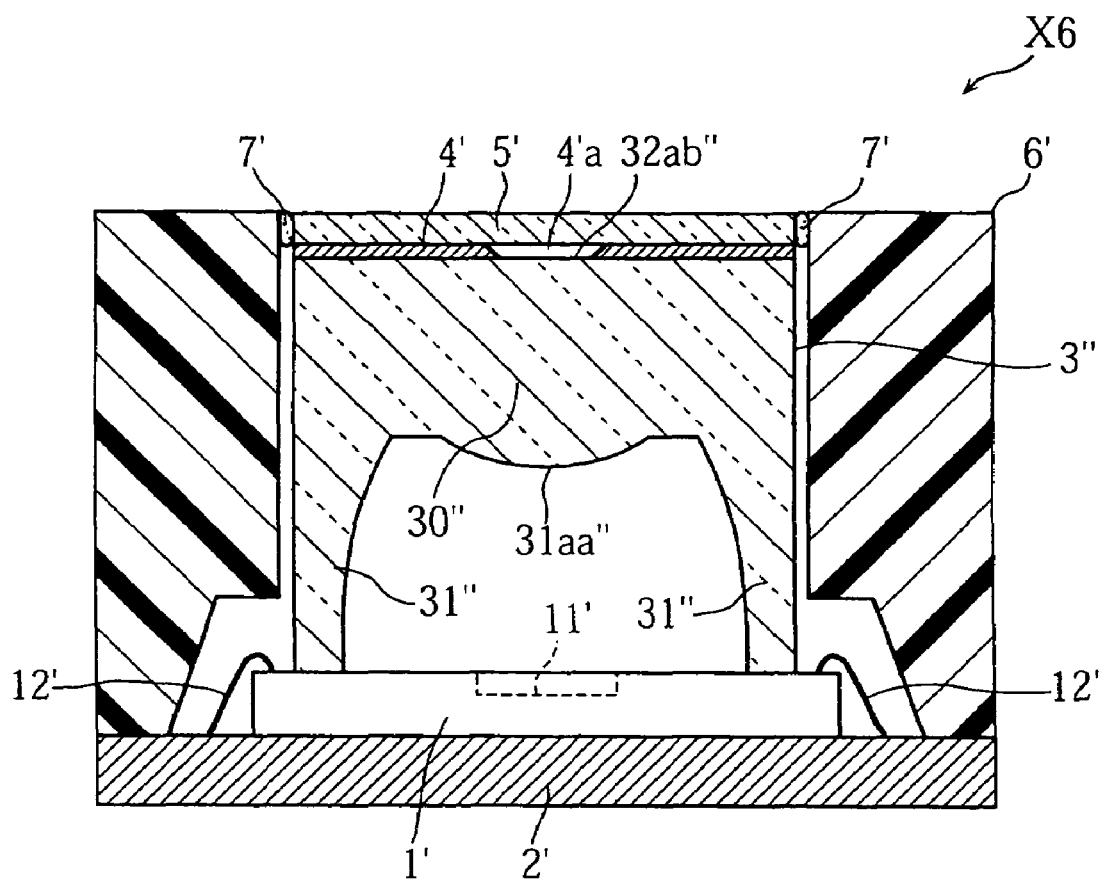
FIG. 18 is a cross-sectional view depicting the image sensor module according to a sixth embodiment of the present invention.

FIG. 18 shows an image sensor module X6 according to a sixth embodiment of the present invention. The image sensor module X6 has the same structure as the above-mentioned image sensor module X5, except for the lens unit. Specifically, as opposed to the lens unit 3' of the module X5 which comprises the combination of the two lenses 31, 32, the lens unit 3" of the module X6 comprises only a single lens. As FIG. 18 shows, the lens unit 3" comprises a lens section 30" which includes a convex lens face 31aa and a flat lens face 32ab". The lens unit 3" also includes a spacer 31" integrated with the lens section 30".

The spacer of the lens need not necessarily be cylindrical. The spacer may comprise at least one vertically extending slit. The diaphragm 4' may be formed by coating a light shielding material on the inner face of the optical filter 5'. Further, a light shielding element may be used separately from the lens unit and the optical filter. In this case, the diaphragm 4' may be fixed in the module X6 by sandwiching the diaphragm between the filter 5' and the second lens 32 instead of using an adhesive. If special functions, such as infrared shielding, are not required (e.g. if it is sufficient to only protect the lens), the filter 5' may be replaced with a simple transparent cover.

The present invention being thus described, it is obvious that the present invention may be modified in various ways. Such modifications shall not be excluded from the concept and scope of the present invention, and all modifications obvious to experts in the art shall be included in the following claims.

What is claimed is:

1. An image sensor module comprising:
an image sensor chip mounted on a substrate;
a housing installed on the substrate and having a step portion for retaining a lens above the image sensor chip;
a lens unit placed on the step portion for forming an image of an object on the image sensor chip; and
a lens retainer installed on the housing;
wherein the lens retainer comprises an elastically deformable portion, and the lens unit is pressed against the step portion of the housing by a biasing force caused by the elastically deformable portion; and
wherein the lens unit comprises a combination of a first lens and a second lens, the first lens including a flat contact face and a concave lens face, the second lens including a flat contact face for contact with the flat contact face of the first lens, the second lens further including a convex lens face that is spaced from the concave lens face an projects beyond the flat contact faces of the first and second lenses into a recessed space defined by the concave lens face of the first lens.

2. The image sensor module according to claim 1, wherein the lens retainer further comprises a first portion fixed to an upper race of the housing, and a second portion held in contact with an upper face of the lens unit, the elastically deformable portion being disposed between the first portion and the second portion.

3. The image sensor module according to claim 2, wherein the first portion of the lens retainer is formed with a projection, the upper face of the housing being formed with a recess for engagement with the projection.

4. The image sensor module according to claim 2, wherein the lens retainer covers a portion of the upper face of the lens unit except for a predetermined central area of the lens unit.

5. The image sensor module according to claim 2, wherein the lens unit includes an upper portion protruding above the upper face of the housing.

6. The image sensor module according to claim 2, wherein the lens retainer includes an intermediate portion between the first portion and the second portion, the intermediate portion being formed with a recess for thickness reduction.

7. The image sensor module according to claim 1, wherein the first lens has a positioning projection, the second lens having a recess for engagement with the positioning projection.

8. The image sensor module according to claim 1, further comprising an additional step portion located below the first-mentioned step portion, and an optical filter installed on the additional step portion.

* * * * *